(12) United States Patent
Destouches et al.

(10) Patent No.: US 8,629,719 B2
(45) Date of Patent: Jan. 14, 2014

(54) AMPLIFIER CIRCUIT AND METHOD FOR SIGNAL SENSING

(75) Inventors: Carem Destouches, BP Delft (NL); Bart Balm, AP Kekerdom (NL)

(73) Assignee: EPCOS AG, München (DE)

( * ) Notice: Subject to any disclaimer, the term of this patent is extended or adjusted under 35 U.S.C. 154(b) by 0 days.

(21) Appl. No.: 13/576,649

(22) PCT Filed: Feb. 4, 2010

(86) PCT No.: PCT/EP2010/051377
§ 371 (c)(1),
(2), (4) Date: Oct. 11, 2012

(87) PCT Pub. No.: WO2011/095214
PCT Pub. Date: Aug. 11, 2011

(65) Prior Publication Data
US 2013/0027138 A1    Jan. 31, 2013

(51) Int. Cl.
*H03G 9/00*    (2006.01)
(52) U.S. Cl.
USPC .......................... 330/133; 330/51; 330/124 R
(58) Field of Classification Search
USPC ........................................ 330/133, 51, 124 R
See application file for complete search history.

(56) References Cited

U.S. PATENT DOCUMENTS

| 4,216,446 | A | | 8/1980 | Iwer |
| 4,476,437 | A | | 10/1984 | Fujiwara |
| 4,999,593 | A | | 3/1991 | Anderson |
| 5,101,173 | A | * | 3/1992 | DiPiazza et al. ............... 330/136 |
| 5,128,629 | A | | 7/1992 | Trinh |
| 5,424,694 | A | | 6/1995 | Maloratsky et al. |
| 5,432,473 | A | * | 7/1995 | Mattila et al. .................. 330/133 |
| 5,438,683 | A | * | 8/1995 | Durtler et al. ................... 455/74 |
| 5,646,578 | A | | 7/1997 | Loh et al. |
| 6,020,787 | A | * | 2/2000 | Kim et al. ...................... 330/279 |
| 6,060,949 | A | * | 5/2000 | Kaufman et al. ............... 330/51 |
| 6,307,364 | B1 | | 10/2001 | Augustine |
| 6,897,728 | B2 | * | 5/2005 | Numanami et al. .......... 330/277 |
| 7,023,278 | B1 | * | 4/2006 | Vagher et al. ................. 330/284 |
| 7,623,896 | B2 | * | 11/2009 | Tanaka et al. ................. 455/572 |
| 2002/0025788 | A1 | | 2/2002 | Nitta |
| 2005/0264352 | A1 | | 12/2005 | Ichitsubo et al. |
| 2006/0202757 | A1 | | 9/2006 | Ichitsubo et al. |
| 2008/0012637 | A1 | | 1/2008 | Aridas et al. |

FOREIGN PATENT DOCUMENTS

| EP | 0412392 A2 | 2/1991 |
| EP | 0472330 A2 | 2/1992 |
| EP | 0473299 A2 | 3/1992 |

(Continued)

OTHER PUBLICATIONS

March, "Phase Velocity Compensation in Parallel-Coupled Microstrip", IEEE MTT-S Symposium, Jun. 1982, pp. 410-412.

*Primary Examiner* — Patricia Nguyen
(74) *Attorney, Agent, or Firm* — McDermott Will & Emery LLP

(57) ABSTRACT

An amplifier circuit (10) comprises a driver stage (11) with a driver output (13). Moreover, the amplifier circuit (10) comprises a sensor (12). The sensor (12) comprises a variable attenuator (15) with a control input (16) for receiving a mode signal (SMODE). A sensor output (14) of the sensor (12) is coupled to the driver output (13) via the variable attenuator (15). A sensor signal (SE_RFOUT) is provided at the sensor output (14).

10 Claims, 2 Drawing Sheets

(56) References Cited

FOREIGN PATENT DOCUMENTS

| | | |
|---|---|---|
| EP | 0509733 A2 | 10/1992 |
| GB | 2336047 A | 10/1999 |
| JP | 57-154919 | 9/1982 |
| JP | 61-050410 | 3/1986 |
| JP | 4-100426 A | 4/1992 |
| JP | 4-316205 A | 11/1992 |
| JP | 06-007312 | 1/1994 |
| JP | 2002-076947 A | 3/2002 |
| JP | 2002-217648 A | 8/2002 |
| JP | 2007-036473 A | 2/2007 |
| WO | 0233844 A2 | 4/2002 |

* cited by examiner

AMPLIFIER CIRCUIT AND METHOD FOR SIGNAL SENSING

The present invention relates to an amplifier circuit and a method for signal sensing.

Amplifier circuits often involve a scheme for sensing and controlling the output signal of the amplifier circuit.

Document U.S. Pat. No. 5,128,629 describes a method for controlling the output power of a digital cellular telephone. A coupler and an antenna are connected to the output of the amplifier. When the antenna environment is disturbed, the power sensed by the coupler is no longer an accurate scaled copy of the output power of the amplifier.

Documents US 2005/0264352 A1 and US 2006/0202757 A1 refer to a power amplifier module with a power sensor. Since the power sensor and an antenna are connected to the output of the power amplifier, the antenna—when disturbed—influences the signal generated by the power sensor.

Document US 2008/0012637 A1 is related to a power amplifier circuit. A coupler is coupled to a connection line between a power amplifier driver and a power amplifier. An attenuator and an amplifier are connected to an output of the coupler.

It is an aim of the invention to provide an amplifier circuit and a method for signal sensing that generates a sensor signal which depends on a mode signal that sets a mode of operation of the amplifier circuit.

The aim is solved by an amplifier circuit according to claim 1 and a method for signal sensing according to claim 10. Embodiments of the amplifier circuit are given in dependent claims.

In an embodiment, an amplifier circuit comprises a driver stage and a sensor. The driver stage has a driver output. The sensor comprises a variable attenuator and a sensor output. The variable attenuator has a control input. A mode signal is provided to the control input of the variable attenuator. The mode signal sets a mode of operation of the amplifier circuit. A sensor signal is provided at the sensor output. The variable attenuator couples the driver output to the sensor output.

It is an advantage of the variable attenuator that the attenuation depends on the mode signal and, therefore, on the mode of operation of the amplifier. Thus, the sensor signal does not only depend on a driver output signal at the driver output but also on the mode signal.

In an embodiment, the amplifier circuit has at least two modes of operation. The amplifier circuit may have multiple modes of operation. The multiple modes of operation refer here to an amplifier whose performance can be adjusted to optimum level for different output power ranges using discrete steps, like for example a "High Power Mode" for an output power between 17 and 29 dBm, a "Medium Power Mode" for an output power between 7 and 17 dBm, and a "Low Power Mode" for an output power below 7 dBm. Thus, the different modes of operation of the amplifier circuit correspond to different output power ranges of the amplifier circuit. The mode of operation in which the amplifier circuit is set by selection of one of the multiple modes of operation depends on the selected output power range.

In an embodiment, the variable attenuator is designed to provide the sensor signal depending on the driver output signal and a variable attenuation factor. The attenuation factor is the ratio between the driver output signal and the sensor signal. The variable attenuation factor is set by the mode signal. The driver output is coupled to the variable attenuator. The sensor delivers the sensor signal whose magnitude is proportional to the output power of the amplifier circuit. The output power depends on the mode of operation of the amplifier. One advantage of having a variable attenuator is to keep the same power sensing ratio in all modes of operation. The "power sensing ratio" is the ratio between the output power of the amplifier circuit and the power at the sensor output. It is an advantage of the variable attenuation factor that the attenuation depends on the mode of operation of the amplifier. Thus, the sensor signal does not only depend on the driver output signal but also on the mode signal. The mode signal may be a binary logic signal that sets a mode of operation of the amplifier circuit, like a "High Power Mode" or a "Medium Power Mode". The mode signal can be a logic bus signal comprising multiple bits in case of more than two modes of operation.

In an embodiment, the variable attenuator comprises a change-over switch. The change-over switch is controlled by the mode signal. A control input of the change-over switch is connected to the control input of the variable attenuator. An output of the change-over switch is coupled to the sensor output.

The variable attenuator may be implemented such that the attenuation factor is set by the mode signal. The variable attenuator can be designed to provide a first and a second attenuation factor. The first or the second attenuation factor is chosen in dependency of the mode signal. The first or the second attenuation factor can be selected by means of the change-over switch.

In a development, the variable attenuator comprises a first and a second attenuator circuit. The first and the second attenuator circuits are coupled on their input sides to the driver output. An output of the first attenuator circuit is coupled to a first input of the change-over switch. Further on, an output of the second attenuator circuit is coupled to a second input of the change-over switch. The first attenuator circuit provides the first attenuation factor and the second attenuator circuit provides the second attenuation factor. The first and the second input of the change-over switch are high-frequency inputs, abbreviated RF inputs. The output of the change-over switch is a high-frequency output, abbreviated RF output. Thus, the inputs of the change-over switch are coupled to attenuator circuits with constant, but different attenuation factors. The attenuation factor associated to the "High Power" mode of operation is lower than the attenuation factor associated to the "Medium Power" mode of operation. The difference between these two attenuation factors satisfies the requirement of an equal power sensing ratio between the "High Power" and "Medium Power" modes of operation.

In an embodiment, the amplifier circuit comprises a final stage which couples the driver output to an output terminal of the amplifier circuit. The driver stage and the final stage are connected in series. Since the variable attenuator is connected to the driver output, the variable attenuator is connected to a node between the driver stage and the final stage. The final stage advantageously provides an isolation of the sensor from an electrical load which is connected to the output terminal of the amplifier circuit. Thus, the load condition does not influence the sensor signal. The sensitivity to antenna disturbances is reduced.

The driver output can be arranged between the driver stage and the final stage.

In an embodiment, the sensor comprises an RF conductive path which couples the driver output to the sensor input. RF is used as abbreviation for high frequency. The conductive path can be realized as a resistive path or a capacitive coupling. Thus, the coupling of the sensor input to the driver output is free of a parallel coupled lines type of coupler, which provides an advantage in term of size.

In an alternative embodiment, the sensor comprises a conductive path which directly connects the driver output to the sensor input. The conductive path can be realized as a resistive path. Thus, the coupling of the sensor input to the node between the driver stage and the final stage is free of a coupler.

In an embodiment, the mode signal sets the mode of operation of the final stage which will change its RF gain.

In a development, two modes of operation are implemented in the amplifier circuit. In the first mode of operation, both the driver stage and the final stage are active, wherein the final stage amplifies the driver output signal. In the second mode of operation, both the driver stage and the final stage are active, wherein the driver stage and the final stage provide the RF gain with a second value which is lower in comparison to a first value of the RF gain obtained in the first mode of operation. Alternatively, in the second mode of operation, the driver stage is active, wherein the final stage provides the driver output signal to an output node of the amplifier circuit via a bypass without amplification.

In an embodiment, the first mode of operation is the "High Power Mode". In the first mode of operation, the mode signal sets the bias circuits of the driver stage and final stage to obtain a first value of the quiescent current, which will result in the first value of the RF gain. The first value of the RF gain allows the amplifier circuit to operate in a "High Power Mode" and deliver an output power within a high range of values. The second mode of operation can be the "Medium Power Mode". In the second mode of operation, the mode signal sets the bias circuits of the driver stage and of the final stage to obtain a lower value of the quiescent current. This results in the second value of the RF gain which is lower than the first value, but allows the amplifier circuit to deliver an output power within a lower range of values, while maintaining efficiency to an optimum. In this case, both the driver stage and the final stage still amplify the RF signal. Alternatively, in the second mode of operation, so called "Medium Power Mode", the mode signal can also set the bias circuit of the final stage to completely shut the final stage down, in which case only the driver stage amplifies the RF signal. It is then necessary to bypass the final stage to deliver the RF signal to the output terminal of the amplifier circuit, for example with a bypass RF switch activated by the mode signal. So, when switching from the "High Power Mode" to the "Medium Power Mode", the value of the RF gain changes with a difference Delta_G. If not compensated by the variable attenuator, the power sensing ratio between a "High Power Mode" and a "Medium Power Mode" would undergo the same difference Delta_G, which is not desirable from a system point of view because it would add to the complexity of the power control scheme. Therefore, the variable attenuation factor in the sensor advantageously compensates the variation of the RF gain to maintain an equal power sensing ratio between the two modes of operation.

In an embodiment, a semiconductor body comprises the amplifier circuit. The amplifier circuit can be realized on a first surface of exactly one semiconductor body. The material of the semiconductor body may be gallium-arsenide, abbreviated GaAs, or silicon, abbreviated Si.

In an alternative embodiment, a first semiconductor body comprises the driver stage and a second semiconductor body comprises the sensor. The first semiconductor body may additionally comprise at least one of the input stage and the final stage. The material of at least one of the first and the second semiconductor bodies may be gallium-arsenide, abbreviated GaAs, or silicon, abbreviated Si. The first and the second semiconductor body are arranged on a laminate, a printed circuit board, abbreviated PCB, or a low-temperature co-fired ceramic, abbreviated LTCC.

According to a development, a communication arrangement comprises the amplifier circuit including the sensor, a detector circuit, a transceiver and a baseband unit. In an embodiment, these elements define all together the power control scheme of the communication arrangement, which can be basically described as follows:

a: The sensor embedded in the amplifier circuit generates a sensor signal that is a linear scaled copy of the output signal at the output terminal of the amplifier circuit.

b: The sensor signal of the sensor is coupled to an input of the detector circuit. The detector circuit is realized as a power detector. The detector circuit generates a detector output signal that is a monotonous function of its RF input power. Within a certain range of power, the detector output signal is a linear function of the RF input power expressed in dBm. The detector output signal is a DC voltage.

c: The detector output signal is coupled to a control input of the baseband unit. The baseband unit compares the detector output signal with a predetermined value of the detector output signal. The baseband unit generates a control signal depending on the detector output signal and the predetermined value of the detector output signal. The predetermined value was calibrated for different supply voltages, frequencies and temperatures conditions. The baseband unit operates by counteracting the variations inside the loop—increasing or decreasing the control signal—so that the detector output signal is adjusted to the appropriate predetermined value.

d: The control signal of the baseband unit is coupled to an input terminal of the transceiver. The control signal is used to set linearly the output power of the transceiver.

e: A RF transceiver output signal of the transceiver is coupled to the input terminal of the amplifier circuit. The amplifier circuit generates the output signal, and the process of power control goes back to a. Thus, the communication arrangement advantageously has an efficient power control loop topology. The proper operation of such a scheme relies on the fact that the sensor delivers a sensor signal that is an accurate scaled copy of the output signal of the amplifier circuit. This has to be achieved even when the antenna is disturbed.

In an embodiment, a method for signal sensing comprises generating a driver output signal by amplifying a driver input signal. Furthermore, a sensor signal is provided by attenuating the driver output signal. A mode signal sets a mode of operation of an amplifier circuit for signal amplification. The attenuation of the driver output signal depends on the mode signal.

It is an advantage of the method that the sensor signal is a function of the mode of operation of an amplifier circuit. Therefore, the method for signal sensing uses a method for sensing an output signal of the amplifier circuit which can be used in a power control loop as described above. The control loop results in a reduced sensitivity to antenna disturbance.

In an embodiment, an output signal is generated by amplification of the driver output signal. The amplification depends on the mode signal.

The invention is described in more detail by referring to the embodiments and the relating figures. Devices with the same structure or with the same effect are denoted with equal reference numerals. A description of a part of a circuit or of a device having the same function in different figures will not be repeated in each of the following figures.

Figure 1:
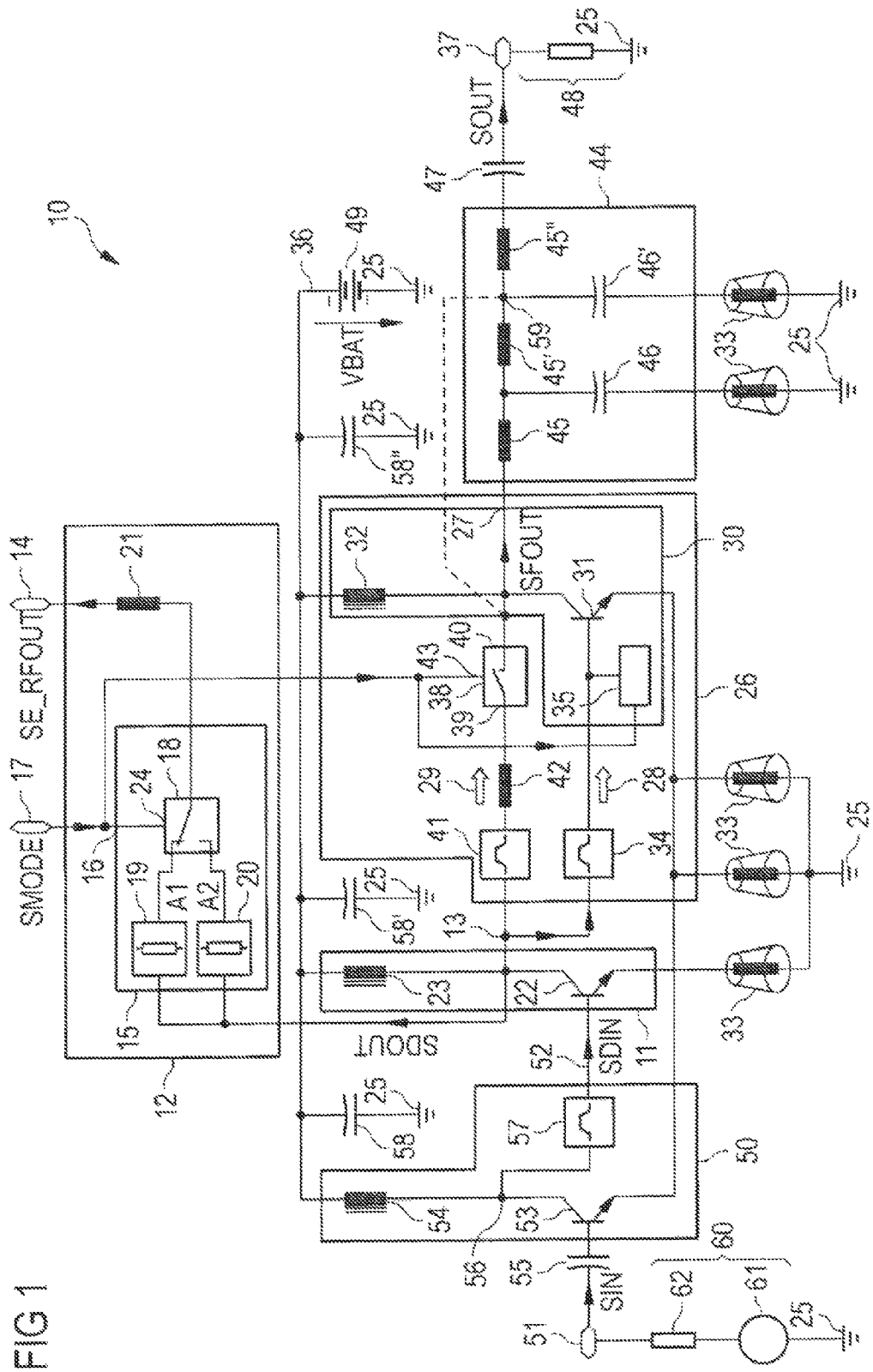
FIG. 1 shows an exemplary amplifier circuit according to the invention.

FIG. 1 shows an exemplary amplifier circuit. The amplifier circuit 10 comprises a driver stage 11 and a sensor 12. The sensor 12 couples a driver output 13 of the driver stage 11 to the sensor output 14. The sensor 12 comprises a variable attenuator 15. A control input 16 of the variable attenuator 15 is connected to a mode signal input 17. An output of the variable attenuator 15 is connected to the sensor output 14. The variable attenuator 15 comprises a change-over switch 18. Furthermore, the variable attenuator 15 comprises a first and a second attenuator circuit 19, 20. The first attenuator circuit 19 couples the driver output 13 to a first RF input of the change-over switch 18. The second attenuator circuit 20 couples the driver output 13 to a second RF input of the change-over switch 18. An RF output of the change-over switch 18 is coupled to the sensor output 14. A sensor transmission line 21 is connected between the change-over switch 18 and the sensor output 14. The control input 16 of the variable attenuator 15 is connected to a control input 24 of the change-over switch 18.

The driver stage 11 comprises a driver transistor 22 and a driver RF choke 23. The driver transistor 22 is fed through the driver RF choke 23. A series connection of the driver transistor 22 and the driver RF choke 23 couples a supply voltage terminal 36 to a reference potential terminal 25. The driver output 13 is connected to a node which is between the driver transistor 22 and the driver RF choke 23.

Moreover, the amplifier circuit 10 comprises a final stage 26. The final stage 26 couples the driver output 13 to an amplifier output node 27 of the amplifier circuit 10. The final stage 26 comprises a first and a second path 28, 29. The first path 28 comprises a final stage amplifier 30. The final stage amplifier 30 has a final stage transistor 31 and a final stage RF choke 32. The final stage transistor 30 is fed through the final stage RF choke 32. A series connection of the final stage transistor 31 and the final stage RF choke 32 couples the supply voltage terminal 36 to the reference potential terminal 25. The reference potential terminal 25 may be realized on a backside of a substrate. Thus, vias 33 may be used for the connection to the reference potential terminal 25. The first path 28 comprises an inter-stage 2-3 matching network 34 which is connected between the driver output 13 and an input terminal of the final stage amplifier 30. The final stage amplifier 30 comprises an adjustable bias circuit 35. The mode signal input 17 is connected to a control input of the bias circuit 35. An output of the bias circuit 35 is connected to an input terminal of the final stage transistor 31. The amplifier output node 27 is formed by a node between the final stage RF choke 32 and the final stage transistor 31. The amplifier output node 27 is coupled to an output terminal 37 of the amplifier circuit 10. A parallel circuit of the first and the second path 28, 29 couples the driver output 13 to the amplifier output node 27.

Further on, the second path 29 comprises a bypass RF switch 38 with an input 39 and an output 40. The bypass RF switch 38 couples the driver output 13 to the amplifier output node 27.

A bypass matching network 41 and a transmission line 42 are connected between the driver output 13 and the bypass RF switch 38. A control terminal 43 of the bypass RF switch 38 is coupled to the mode signal input 17. The amplifier output node 27 is coupled to the output terminal 37 of the amplifier circuit 10 via an output matching network 44. The output matching network 44 comprises a first, a second and a third transmission line 45, 45', 45" as well as a first and a second matching capacitor 46, 46'. An output capacitor 47 couples the output matching network 44 to the output terminal 37. An electrical load 48 is connected to the output terminal 37. The electrical load 48 is equivalent to a 50 Ohm resistor. A supply voltage source 49 is connected between the supply voltage terminal 36 and the reference potential terminal 25.

Further on, the amplifier circuit 10 comprises an input stage 50. The input stage 50 couples an input terminal 51 of the amplifier circuit 10 to a driver input 52 of the driver stage 11. The input stage 50 comprises an input stage transistor 53 and an input stage RF choke 54. A series connection of the input stage transistor 53 and the input stage RF choke 54 is coupled between the supply voltage terminal 36 and the reference potential terminal 25. The input stage transistor 53 is fed through the input stage RF choke 54. An input capacitor 55 couples the input terminal 51 to an input terminal of the input stage transistor 53. An input stage node 56 between the input stage transistor 53 and the input stage RF choke 54 is coupled via an inter-stage 1-2 matching network 57 to the driver input 52 of the driver stage 11. The driver input 52 is connected to an input terminal of the driver transistor 22. Three capacitors 58, 58', 58" couple the supply voltage terminal 36 to the reference potential terminal 25. The amplifier circuit 10 is fed at the RF input terminal 51 with a signal generator 60, which may be seen here as the equivalent circuit of a transceiver output. The signal generator 60 is equivalent to a series circuit of a power source 61 and a source impedance 62.

A mode signal SMODE is provided to the mode signal input 17. The amplifier circuit 10 comprises multiple modes of operation which are controlled by the mode signal SMODE. The mode signal SMODE is used to switch between a first mode and a second mode of operation of the amplifier circuit 10. The first mode is a "High Power Mode" and the second mode is a "Medium Power Mode". In this case, the mode signal SMODE is a one bit logic signal. A sensor signal SE_RFOUT is generated out of a driver output signal SDOUT at the driver output 13 by means of the sensor 12. The variable attenuator 15 generates the sensor signal SE_RFOUT using the driver output signal SDOUT. The mode signal SMODE is applied to the control input 24 of the change-over switch 18 of the variable attenuator 15.

In the first mode of operation of the amplifier circuit 10, a RF path comprising the first attenuator circuit 19 is selected, providing a first (lower) value of the RF attenuation factor A1 from the driver output 13 to the sensor output 14. Thus, an output signal from the first attenuator circuit 19 is provided via the change-over switch 18 as the sensor signal SE_RFOUT.

In the second mode of operation of the amplifier circuit 10, a RF path comprising the second attenuator circuit 20 is selected, providing a second (higher) value of the RF attenuation factor A2 from the driver output 13 to the sensor output 14. Thus, an output signal from the second attenuator circuit 20 is provided via the change-over switch 18 as the sensor signal SE_RFOUT.

The mode signal SMODE is fed to the control input of the bias circuit 35 of the final stage 26, and to the control terminal 43 of the bypass RF switch 38. Thus, the mode signal SMODE sets the bias of the final stage transistor 31.

The first path 28 is active in the "High Power Mode" of operation. In the first mode of operation, the final stage amplifier 30 is set active by the mode signal SMODE. The final stage 26 provides an RF amplification gain G_Final [dB]. In the "High Power Mode", the mode signal SMODE sets the bypass RF switch 38 in open state, and turns on the bias circuit 35 of the final stage amplifier 30. The bias circuit 35 activates the final stage amplifier 30. The final stage amplifier 30 amplifies then the driver output signal SDOUT from the driver output 13 and provides a final stage output signal SFOUT to the amplifier output node 27.

The second path 29 is active in the "Medium Power Mode" of operation. In the "Medium Power Mode", the mode signal SMODE sets the bypass RF switch 38 in closed state, and turns off the bias circuit 35 of the final stage 26. Thus, the bias circuit 35 de-activates the final stage amplifier 30. The bypass RF switch 38 bypasses the final stage amplifier 30, and couples the driver output signal SDOUT from the driver output 13 to the amplifier output node 27 without amplification. When switching from the "High Power Mode" to the "Medium Power Mode", the amplifier circuit 10 will exhibit a difference in its RF gain Delta_G=G_Final.

The final stage output signal SFOUT is then transferred to the output terminal 37 of the amplifier circuit 10 via the output matching network 44 and the output capacitor 47. In the second path 29, the RF gain of the amplifier circuit 10 has been reduced by the value of the RF gain G_Final of the final stage amplifier 30. In order to keep a consistent power sensing ratio between the first and the second mode of operation, the attenuation factor in the sensor 12 has to be increased by Delta_G which is equal to G_Final that is the RF gain of final stage amplifier 30. Thus, the difference between the first attenuation factor A1 and the second attenuation factor A2 has to satisfy the following condition expressed in dB:

$$A2-A1=\text{Delta\_}G=G\_\text{Final [dB]}.$$

The first attenuation factor A1 is provided by the first attenuator circuit 19 and the second attenuation factor A2 is provided by the second attenuator circuit 20. The first attenuation factor A1 is lower than the second attenuation factor A2. In the first mode, the "High Power Mode" of operation, the output of the first attenuator circuit 19 is switched to the sensor output 14. In the "Medium Power Mode" mode of operation, the output of the second attenuator circuit 20 is switched to the sensor output 14 to reduce the power sensed from the driver output 13 for keeping the power sensing ratio unchanged. The sensor signal SE_RFOUT1 in the first mode, the "High Power Mode" of operation, and the sensor signal SE_RFOUT2 in the second mode, the "Medium Power Mode" of operation, can be calculated according to the following equations:

$$\text{SE\_RFOUT1} = \frac{SDOUT}{A1} \text{ and SE\_RFOUT2} = \frac{SDOUT}{A2},$$

wherein SDOUT is the value of the driver output signal.

A DC supply voltage VBATT is provided by the supply voltage source 49 and is supplied to the input stage 50, the driver stage 11 and the final stage 26. An input signal SIN is provided to the input stage 50. The input stage 50 amplifies the input signal SIN from the input terminal 51 of the amplifier circuit 10 and provides a driver input signal SDIN to the driver input 52 of the driver stage 11. The driver stage 11 generates the driver output signal SDOUT at the driver output 13. The driver output signal SDOUT is applied to the final stage 26. The final stage output signal SFOUT is generated via the first or the second path 28, 29 of the final stage 26. The final stage output signal SFOUT can be tapped off at the amplifier output node 27. An output signal SOUT can be tapped off at the output terminal 37 and is generated by the output matching network 44 out of the final stage output signal SFOUT.

The amplifier circuit 10 is implemented as a power amplifier. The sensor 12 is realized for power sensing. The sensor 12 is embedded in the high-frequency line-up of the amplifier circuit 10. The sensor 12 re-routes a portion of the RF power at the driver output 13 to the sensor output 14.

In the "High Power Mode" operation of the amplifier circuit 10, for a 50Ω load condition, that means no disturbance of an antenna comprised by the electrical load 48, it is possible to design the final stage 26 to achieve a minimum gain variation $\partial^3 G\_\text{Final}/\partial V \partial F \partial T$ over supply voltage VBATT, frequency F and temperature conditions. Thus, sensing the power at the driver output 13 provides reasonably accurate information about the power at the output terminal 37. In mismatch load condition, that means disturbed antenna environment, a signal tapped off at the output matching network 44 for example by a parallel-coupled transmission lines coupler can prove to be more sensitive to the load variation than the amplifier circuit 10 itself, significantly disturbing the operation of the power control loop. Therefore, embedding the sensor 12 in the RF line up at the driver output 13 of the driver stage 11 as shown in FIG. 1 takes advantage of the isolation provided by the final stage 26 to reduce efficiently the sensitivity of the power sensing to load mismatch. It prevents an erroneous reaction of the power control loop as a result of an isolation provided by the final stage 26, ensuring a more robust operation of a radio communication system.

In the "Medium Power Mode" operation of the amplifier circuit 10, the final stage amplifier 30 is turned OFF and bypassed. The power will be sensed directly from the last active stage of the amplifier circuit 10 which is the driver stage 11 in this mode of operation. In that case, the driver stage 11 operates at reasonable back-off, allowing reduced sensitivity to load mismatch. The performance of a multi mode power amplifier can be the result of a tradeoff between the "High Power Mode" and the "Medium Power Mode". It is preferable to optimize the "High Power Mode" and sacrifice a little bit of performance for the "Medium Power Mode", mostly efficiency, by operating the line up at a more significant back-off, that means further away from its saturation point, in the second mode of operation.

The "High Power Mode"/"Medium Power Mode" scheme presented here is just an example to illustrate the power sensing method. Alternative embodiments are described in the following:

In FIG. 1, the bypass matching network 41 is connected to the input 39 of the bypass RF switch 38, in which case it does not influence the output matching network 44 in the "High Power Mode", that is the most critical mode to optimize. In an alternative, not shown embodiment, the bypass matching network 41 is implemented at the output 40 of the bypass RF switch 38, in which case it would not influence the inter-stage 2-3 matching network 34.

In FIG. 1, the output 40 of the bypass RF switch 38 is connected to the amplifier output node 27 as the output of the final stage 26. In an alternative embodiment which is indicated by a broken line, the output 40 of the bypass RF switch 38 is connected to a node inside the output matching network 44, at a network node 59 between the second and the third transmission line 45', 45" for example.

In FIG. 1, the bypass RF switch 38 is used to bypass the final stage amplifier 30 in "Medium Power Mode" operation, which gives more flexibility to independently optimize the "High Power Mode" and the "Medium Power Mode". In an alternative, not shown embodiment, the bypass RF switch 38 is omitted. The bypass RF switch 38 is replaced by a short-circuit. Thus, the bypass matching network 41 acts as a feedback network for the final stage amplifier 30 in the "High Power Mode", and as a bypass matching network in the "Medium Power Mode".

In an alternative, not shown embodiment, the amplifier circuit 10 comprises only two stages, namely the driver stage 11 and the final stage 26. The input stage 50 is omitted. The input terminal 51 is directly connected to the driver input 52.

In an alternative, not shown embodiment, the amplifier circuit 10 comprises more than three stages.

In an alternative, not shown embodiment, the amplifier circuit 10 can operate in more than two modes of operation. Thus, the variable attenuator 15 may comprise more than two attenuator circuits for providing more than two attenuation factors. A third mode of operation can be a "Low Power Mode".

Figure 2:
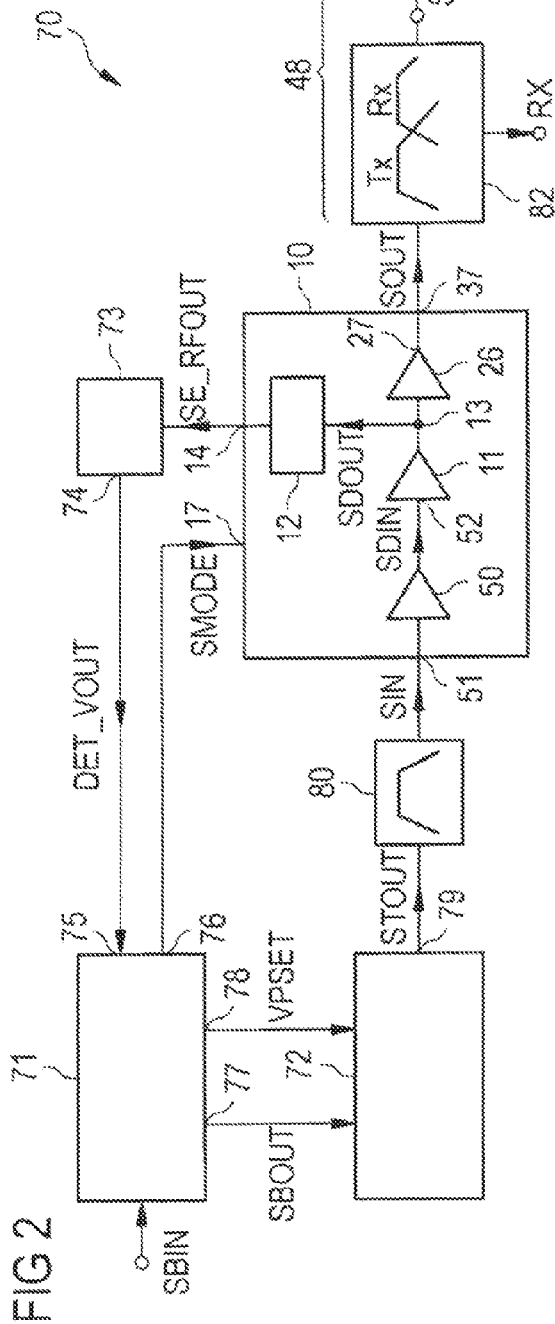
FIG. 2 shows an exemplary communication arrangement according to the invention.

FIG. 2 shows an exemplary communication arrangement. The communication arrangement 70 comprises the amplifier circuit 10 shown in FIG. 1, a baseband unit 71, a transceiver 72, and a detector circuit 73. The sensor output 14 of the sensor 12 is coupled via the detector circuit 73 to the baseband 71. The detector circuit 73 is implemented as a rectifier. An output 74 of the detector circuit 73 is coupled to a control input 75 of the baseband unit 71. A control output 76 of the baseband unit 71 is connected to the mode signal input 17 of the amplifier circuit 10. A further control output 78 of the baseband unit 71 is connected to a control input of the transceiver 72. A signal output 77 of the baseband unit 71 is connected to a signal input of the transceiver 72. An RF signal output 79 of the transceiver 72 is coupled to the input terminal 51 of the amplifier circuit 10 via an input filter 80. The output terminal 37 of the amplifier circuit 10 is coupled to an antenna 81. An output filter 82 is connected in-between the output terminal 37 and the antenna 81. The output filter 82 is implemented as a duplexer. Thus, the electrical load 48 at the output terminal 37 comprises the output filter 82 and the antenna 81.

A baseband input signal SBIN which comprises the information that has to be transmitted is provided to the baseband unit 71. The baseband unit 71 generates a baseband output signal SBOUT using the baseband input signal SBIN. The baseband output signal SBOUT is provided to the transceiver 72 for modulation. Moreover, the baseband unit 71 generates a control signal VPSET which is provided to the transceiver 72. The transceiver 72 generates a transceiver output signal STOUT which is provided to the input terminal 51 of the amplifier circuit 10. The input filter 80 filters the transceiver output signal STOUT.

By the mode signal SMODE, the performance of the amplifier circuit 10 can be adjusted to an optimum level for different output power ranges. The baseband unit 71 changes the value of the mode signal SMODE in dependency of the power range to be generated at the output terminal 37. The output signal SOUT at the output terminal 37 is provided to the antenna 81 via the output filter 82. An antenna signal SANT is applied to the antenna 81. The output filter 82 provides a received signal RX depending on the antenna signal SANT. The power level of the output signal SOUT is maintained at a predetermined value over a wide range of operating conditions. The sensor signal SE_RFOUT at the output of the variable attenuator 15 is a high-frequency signal. The detector circuit 73 rectifies the sensor signal SE_RFOUT from the sensor output 14. The detector circuit 73 generates a DC signal which is provided as the detector output signal DET_VOUT to the control input 75 of the baseband unit 71.

The integration of power sensing in the high-frequency line-up takes advantage of the isolation provided by the final stage 26. When the antenna environment is disturbed, for example by the effect of a hand, a mismatch condition occurs. If a coupler, such as a parallel-coupled transmission lines coupler for example, were implemented at the output of the amplifier circuit 10 between the output terminal 37 and the input of the output filter 82, such a coupler would be directly exposed to the variation of the electrical load 48. Its response would be affected by the variation of the load 48 and it would no more accurately replicate the power at the output terminal 37 inducing an erroneous correction by the power control loop. However, as shown in FIG. 1, the final stage 26 provides isolation for the sensor 12 from disturbances induced by the electrical load 48 such as the antenna 81. Therefore, the sensor signal SE_RFOUT shows less sensitivity to a varying electrical load 48, for example when the antenna 81 is disturbed. Thus, a more robust operation of the power control loop is achieved. The power control loop comprises the amplifier circuit 10 with its sensor 12, the detector circuit 73, the baseband unit 71 and the transceiver 72.

In the amplifier circuit 10 shown in FIGS. 1 and 2, the use of a coupler is circumvented for two reasons: If a conventional coupler, such as a parallel-coupled transmission lines coupler, were used at the same position as the sensor 12 described in FIG. 1, it would also take advantage of the isolation provided by the final stage 26, but it would not be possible to adjust the coupling ratio depending on the mode of operation of the amplifier circuit 10, such as the "High Power Mode" or the "Medium Power Mode". Thus, there would be a difference Delta_G=G_Final, which is the gain of the final stage 26, in the power sensing ratio between the two modes of operation.

Moreover, a conventional coupler, such as a parallel-coupled transmission lines coupler, is a rather bulky element in a radio-communication arrangement, even at RF frequencies. It cannot be implemented on the same semiconductor body as the amplifier circuit 10. Therefore, the sensor 12, which can be achieved in a very compact size, offers the advantage that it can be implemented on the same semiconductor body as the amplifier circuit 10.

The amplifier circuit 10 is integrated in a compact high-frequency module that can be used in wireless applications.

In an alternative, not shown embodiment, the power sensing is performed at the output of more than one stage with the exception of the final stage 26 and recombined by means of a power combiner. A further sensor may couple the input stage node 56 to the detector circuit 73 which combines the sensor signal SE_RFOUT and a signal of the further sensor.

Figure 3:
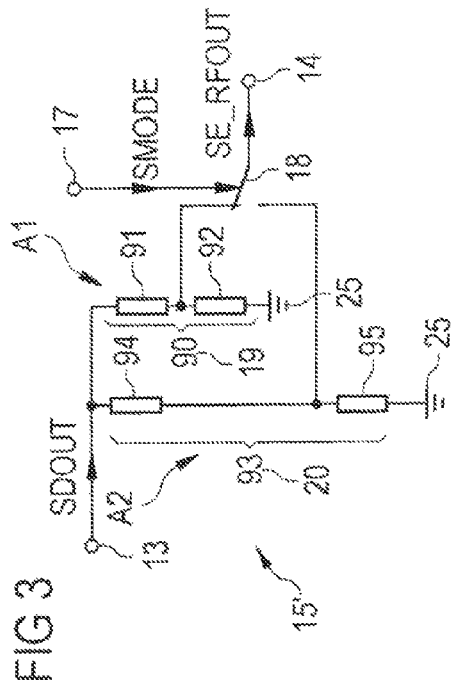
FIG. 3 shows an exemplary sensor according to the invention.

FIG. 3 shows an exemplary embodiment of a variable attenuator. The variable attenuator 15' can be used in the sensor 12 of FIGS. 1 and 2. The first attenuator circuit 19 comprises a first voltage divider 90 having a first and a second divider resistor 91, 92. A node between the first and the second divider resistor 91, 92 is connected to the first input of the change-over switch 18. The second attenuator circuit 20 comprises a second voltage divider 93 having a third and a fourth divider resistor 94, 95. A node between the third and the fourth divider resistor 94, 95 is connected to the second input of the change-over switch 18.

The driver output signal SDOUT is provided to the first and to the second voltage divider 90, 93. The first voltage divider 90 provides a signal to the first input terminal of the change-over switch 18 according to the first attenuation factor A1. Accordingly, the second voltage divider 93 generates a signal to the second input of the change-over switch 18 according to the second attenuation factor A2. The first attenuation factor A1 is smaller than the second attenuation factor A2. The first and the second voltage divider 90, 93 are used as power dividers.

In an alternative, not shown embodiment, the first, second, third and fourth divider resistors 91, 92, 94, 95 are replaced by a first, second, third and fourth divider capacitor.

Figure 4:
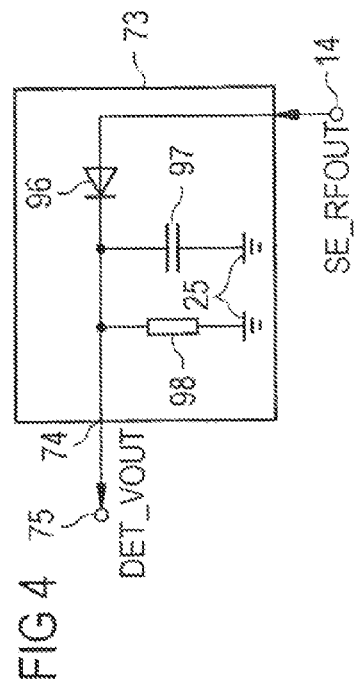
FIG. 4 shows an exemplary detector circuit.

FIG. 4 shows an exemplary embodiment of the detector circuit 73. The detector circuit 73 can be inserted in the communication arrangement shown in FIG. 2. The detector circuit 73 comprises a detector diode 96, a detector capacitor 97 and a detector resistor 98. The detector output signal DET_VOUT is a rectified and low-pass filtered signal of the sensor signal SE_RFOUT.

| Reference numerals | |
|---|---|
| 10 | amplifier circuit |
| 11 | driver stage |
| 12 | sensor |
| 13 | driver output |
| 14 | sensor output |
| 15, 15' | variable attenuator |
| 16 | control input |
| 17 | mode signal input |
| 18 | change-over switch |
| 19 | first attenuator circuit |
| 20 | second attenuator circuit |
| 21 | sensor transmission line |
| 22 | driver transistor |
| 23 | driver RF choke |
| 24 | control input |
| 25 | reference potential terminal |
| 26 | final stage |
| 27 | amplifier output node |
| 28 | first path |
| 29 | second path |
| 30 | final stage amplifier |
| 31 | final stage transistor |
| 32 | final stage RF choke |
| 33 | via |
| 34 | inter-stage 2-3 matching network |
| 35 | bias circuit |
| 36 | supply voltage terminal |
| 37 | output terminal |
| 38 | bypass RF switch |
| 39 | input |
| 40 | output |
| 41 | bypass matching network |
| 42 | transmission line |
| 43 | control terminal |
| 44 | output matching network |
| 45 | first transmission line |
| 45' | second transmission line |
| 45" | third transmission line |
| 46 | first matching capacitor |
| 46' | second matching capacitor |
| 47 | output capacitor |
| 48 | electrical load |
| 49 | supply voltage source |
| 50 | input stage |
| 51 | input terminal |
| 52 | driver input |
| 53 | input stage transistor |
| 54 | input stage RF choke |
| 55 | input capacitor |
| 56 | input stage node |
| 57 | inter-stage 1-2 matching network |
| 58, 58', 58" | capacitor |
| 59 | network node |
| 60 | signal generator |
| 61 | power source |
| 62 | source impedance |
| 70 | communication arrangement |
| 71 | baseband unit |
| 72 | transceiver |
| 73 | detector circuit |
| 74 | output |
| 75 | control input |
| 76 | control output |
| 77 | signal output |

| Reference numerals | |
|---|---|
| 78 | further control output |
| 79 | RF signal output |
| 80 | input filter |
| 81 | antenna |
| 82 | output filter |
| 90 | first voltage divider |
| 91 | first divider resistor |
| 92 | second divider resistor |
| 93 | second voltage divider |
| 94 | third divider resistor |
| 95 | fourth divider resistor |
| 96 | detector diode |
| 97 | detector capacitor |
| 98 | detector resistor |
| A1 | first attenuation factor |
| A2 | second attenuation factor |
| DET_VOUT | detector output signal |
| RX | received signal |
| SANT | antenna signal |
| SBIN | baseband input signal |
| SBOUT | baseband output signal |
| SDIN | driver input signal |
| SDOUT | driver output signal |
| SE_RFOUT | sensor signal |
| SFOUT | final stage output signal |
| SIN | input signal |
| SMODE | mode signal |
| STOUT | transceiver output signal |
| SOUT | output signal |
| VBATT | supply voltage |
| VPSET | control signal |

The invention claimed is:

1. Amplifier circuit, comprising:
a driver stage with a driver output,
a sensor comprising
   a variable attenuator with a control input for receiving a mode signal, wherein the mode signal is adapted to set a mode of operation of the amplifier circuit, and
   a sensor output for providing a sensor signal, wherein the sensor output is coupled to the driver output via the variable attenuator, as well as
a final stage which couples the driver output to an amplifier output node of the amplifier circuit and is designed for operation in at least two modes of operation, wherein the mode of operation is selected by means of the mode signal.

2. Amplifier circuit according to claim 1,
wherein the variable attenuator is adapted to provide the sensor signal depending on a driver output signal at the driver output and a variable attenuation factor which is set by the mode signal.

3. Amplifier circuit according to claim 1,
wherein the variable attenuator comprises a change-over switch for being controlled by the mode signal.

4. Amplifier circuit according to claim 3,
wherein the variable attenuator comprises
   a first attenuator circuit which is coupled on its input side to the driver output and on its output side to a first input of the change-over switch,
   a second attenuator circuit which is coupled on its input side to the driver output and on its output side to a second input of the change-over switch and
   the change-over switch which is coupled on its output side to the sensor output.

5. Amplifier circuit according to claim 1,
wherein the variable attenuator is designed to provide a first and a second attenuation factor, wherein the first or the second attenuation factor is set active in dependency of the mode signal.

6. Amplifier circuit according to claim 1,
wherein the driver output is a node between the driver stage and the final stage and a conductive path comprising the variable attenuator couples the driver output to the sensor output.

7. Amplifier circuit according to claim 1,
wherein the final stage comprises
   a first path which comprises a final stage amplifier and
   a second path which comprises a bypass RF switch controlled by the mode signal and a bypass matching network and
wherein the first path and the second path couple the driver output to the amplifier output node.

8. Method for signal sensing, comprising:
generating a driver output signal by amplifying a driver input signal,
providing a sensor signal by attenuating the driver output signal, wherein a mode signal sets a mode of operation for signal amplification and the attenuation of the driver output signal depends on the mode signal,
applying the driver output signal to a final stage and
generating a final stage output signal by the final stage, wherein the mode signal sets the mode of operation of the final stage.

9. Amplifier circuit, comprising:
a driver stage with a driver output,
a sensor comprising
   a variable attenuator with a control input for receiving a mode signal, wherein the mode signal is adapted to set a mode of operation of the amplifier circuit, and
   a sensor output for providing a sensor signal, wherein the sensor output is coupled to the driver output via the variable attenuator, as well as
a final stage which couples the driver output to an amplifier output node of the amplifier circuit and comprises
   a first path which comprises a final stage amplifier, and
   a second path which comprises a bypass RF switch controlled by the mode signal and a bypass matching network,
wherein the first path and the second path couple the driver output to the amplifier output node.

10. Method for signal sensing, comprising:
generating a driver output signal by amplifying a driver input signal,
providing a sensor signal by attenuating the driver output signal, wherein a mode signal sets a mode of operation for signal amplification and the attenuation of the driver output signal depends on the mode signal,
applying the driver output signal to a final stage, and
generating a final stage output signal by a first or a second path of the final stage, wherein the first path comprises a final stage amplifier, the second path comprises a bypass RF switch and the mode signal is fed to a control terminal of the bypass RF switch.

\* \* \* \* \*